United States Patent [19]

Masaki

[11] Patent Number: 4,592,027

[45] Date of Patent: May 27, 1986

[54] READ CONTROL CIRCUIT IN A READ ONLY MEMORY SYSTEM

[75] Inventor: Yoshifumi Masaki, Nara, Japan

[73] Assignee: Sharp Kabushiki Kaisha, Osaka, Japan

[21] Appl. No.: 577,970

[22] Filed: Feb. 8, 1984

[30] Foreign Application Priority Data

Feb. 15, 1983 [JP] Japan ................... 58-24312

[51] Int. Cl.[4] ............................... G11C 7/00
[52] U.S. Cl. .................... 365/203; 365/189
[58] Field of Search ................. 365/203, 189

[56] References Cited

U.S. PATENT DOCUMENTS 3,909,631 9/1975 Kitagawa ..................... 365/203
4,262,342 4/1981 Tuan ........................ 365/203

Primary Examiner—James W. Moffitt
Attorney, Agent, or Firm—Birch, Stewart, Kolash & Birch

[57] ABSTRACT

A read control circuit for a read only memory implemented with MOSFETs includes a primary address line for selecting a desired memory cell group, and a secondary address line for selecting a desired data read line in the selected memory cell group. The thus selected data read line is charged to a desired level. Then, an address signal is applied to a desired row address line, whereby a discharging current representing the memory state flows through the selected memory cell and the data read line.

4 Claims, 4 Drawing Figures ers stored in the memory cells $M_{1j}$ through $M_{(i-1)j}$

READ CONTROL CIRCUIT IN A READ ONLY MEMORY SYSTEM

BACKGROUND AND SUMMARY OF THE INVENTION

The present invention relates to a semiconductor read only memory (ROM) system implemented with MOSFETs. The present invention relates, more particularly, to a read control circuit for the read only memory system.

In one type of the conventional read only memory system, the entire data read lines are precharged to conduct the data read operation. Thus, a considerably large current is consumed by the discharge from non-selected data read lines. In another type of the conventional read only memory system, only a selected data read line is charged via a charging element. In this conventional system, the row selection is conducted at the same time when the selected data read line is charged. Therefore, a direct current flows through the charging element and the selected memory cell. Thus, the power consumption is not satisfactorily reduced.

Accordingly, an object of the present invention is to provide a read control circuit for a semiconductor read only memory.

Another object of the present invention is to provide a read control circuit for a CMOSFET read only memory, which minimizes the power consumption at the data reading operation.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, the precharging operation is conducted only to a desired area, thereby minimizing the power consumption caused by the discharge. Furthermore, the data reading operation is conducted after the completion of the precharging operation, thereby preventing the occurence of the direct current through the selected memory cell.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

In order to facilitate better understanding of the present invention, two types of conventional read control circuits will be first described with reference to FIGS. 1 and 2.

Figure 1:
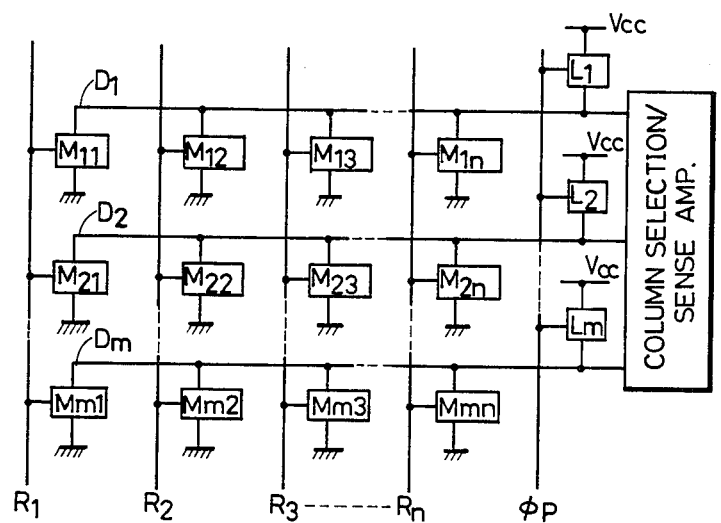
FIG. 1 is a circuit diagram of an example of the conventional read control circuit for a read only memory.

In the conventional system shown in FIG. 1, the entire data read lines $D_1$ through $D_m$ are precharged via charging elements $L_1$ through $L_m$ to which a control signal $\phi_p$ is commonly applied. The actual reading operation is conducted to sense the discharging current from a selected memory cell $M_{11}$ through $M_{mn}$. In such a read control system, since the entire data read lines $D_1$ through $D_m$ are precharged, when the data read line $D_i$ and a row address line $R_j$ are selected, the non-selected data read lines $D_1$ through $D_{i-1}$ and $D_{i+1}$ through $D_m$ create discharging current in accordance with the memory data stored in the memory cells $M_{1j}$ through $M_{(i-1)j}$ and $M_{(i+1)j}$ through $M_{mj}$. The thus created discharging current, which does not affect the actual data reading, will increase the power consumption.

Figure 2:
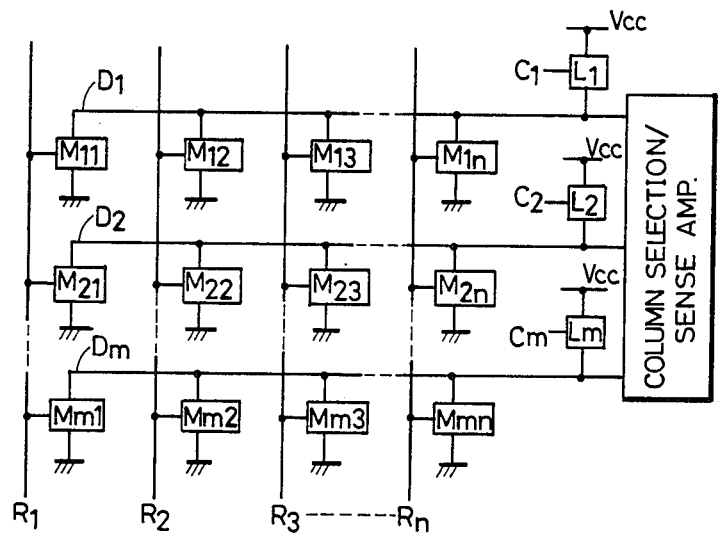
FIG. 2 is a circuit diagram of another example of the conventional read control circuit for a read only memory.

In the conventional system shown in FIG. 2, the charging operation is conducted only to a selected data read line $D_i$ via a charging element $L_i$ in accordance with column address signals $C_1$ through $C_m$. The row selection for the reading operation is conducted at the same time when the selected data read line $D_i$ is being charged. When the data read line $D_i$ and the row address line $R_j$ are selected, direct current flows through the charging element $L_i$ and the selected memory cell $M_{ij}$ in accordance with the memorized data. The direct current increases the power consumption at the reading operation.

Figure 3:
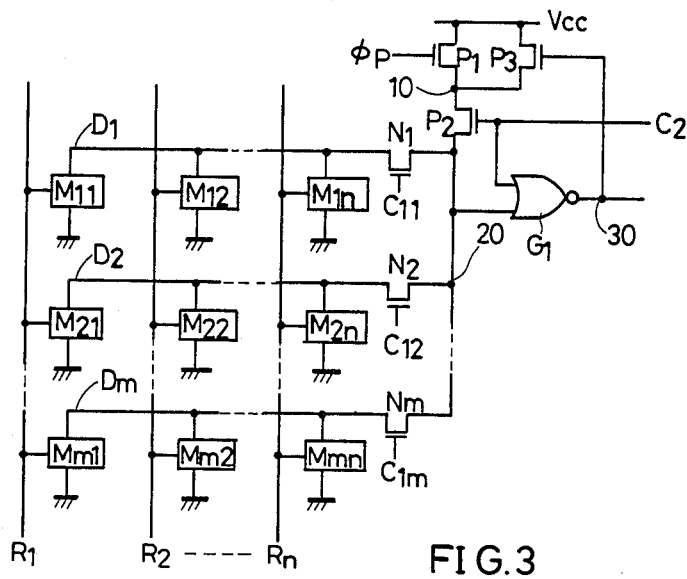
FIG. 3 is circuit diagram of an embodiment of a read control circuit for a read only memory of the present invention.

FIG. 3 shows an embodiment of a data read control system of the present invention implemented with a complementary metal-oxide-semiconductor field-effect-transistor (CMOSFET).

A read only memory system includes a plurality of memory groups, each group including memory cells $M_{11}$ through $M_{mn}$ aligned in the m x n matrix fashion. One memory group includes data read lines $D_1$ through $D_m$ each of which is connected commonly to the n memory cells $M_{i1}$ through $M_{in}$, and row address lines $R_1$ through $R_n$ each of which is commonly connected to the m memory cells $M_{1j}$ through $M_{mj}$. The row address lines $R_1$ through $R_n$ are further connected commonly to the corresponding memory cells in other groups. The read control system of the present invention includes secondary address lines $C_{11}$ through $C_{1m}$ each of which is connected to the data read lines $D_1$ through $D_m$ in the respective memory groups. The read control system of the present invention further includes primary address lines $C_1$ through $C_k$ for selecting a desired memory group. The memory group including the memory cells $M_{11}$ through $M_{mn}$ shown in FIG. 3 is selected by the primary address line $C_2$. The remaining memory groups and the primary address lines $C_1$ and $C_3$ to $C_k$ are not shown for clarity.

The read control system of the present invention further includes p-MOSFETs $P_1$, $P_2$ and $P_3$, n-MOSFETs $N_1$ through $N_m$ which are connected to the corresponding data read lines $D_1$ through $D_m$, and a NOR gate $G_1$. The remaining groups have the same construction as the memory group shown in FIG. 3. A charge control clock $\phi_p$ is applied to the gate electrode of the p-MOSFET $P_1$. The source electrode of the p-MOSFET $P_1$ is connected to the current source line $V_{cc}$, and the drain electrode of the p-MOSFET $P_1$ is connected to the source of the p-MOSFET $P_2$. The drain electrode of the p-MOSFET $P_2$ is commonly connected to the source electrodes of each of the n-MOSFETs $N_1$ through $N_m$. Each of the drain electrodes of the n-MOSFETs $N_1$ through $N_m$ is connected to the corresponding data read line $D_1$ through $D_m$. The above-mentioned secondary address lines $C_{11}$ through $C_{1m}$ are connected to the gate of the corresponding n-MOSFET $N_1$ through $N_m$. The commonly connected source line of the n-MOSFETs $N_1$ through $N_m$ is connected to one input terminal of the NOR gate $G_1$. The above-mentioned primary address line $C_2$ is connected to the gate electrode of the p-MOSFET $P_2$ and the other input terminal of the NOR gate $G_1$. The output signal of the NOR gate $G_1$ is the read out data. The output signal of the NOR gate $G_1$ is further applied to the gate electrode of the p-MOSFET $P_3$. The p-MOSFET $P_3$ is connected to the p-MOSFET $P_1$ in a parallel fashion.

Figure 4:
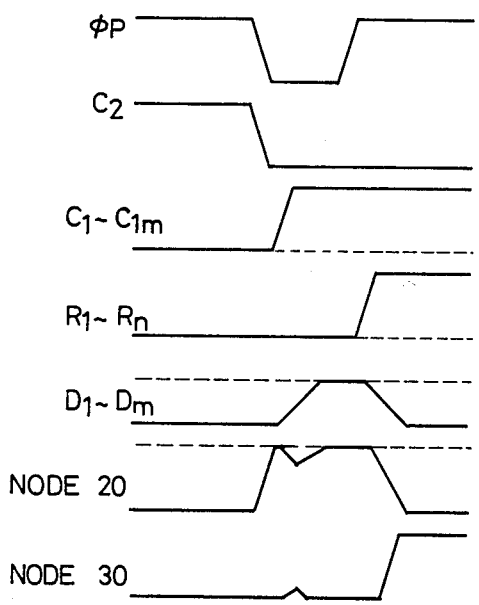
FIG. 4 is a waveform chart showing various signals occurring in the read control circuit of FIG. 3.

An operational mode of the read control system of FIG. 3 will be described with reference to FIG. 4.

In the initial state, the charge control clock $\emptyset_p$ and the primary address line $C_2$ bear the power supply level. The row address lines $R_1$ through $R_n$, and the secondary address lines $C_{11}$ through $C_{1m}$ bear the grounded level. The node 30, which is connected to the output terminal of the NOR gate $G_1$, bears the grounded level. The potentials of the node 10, which is provided between the p-MOSFETs $P_1$ and $P_2$, the node 20, which is commonly connected to the source electrodes of the n-MOSFETs $N_1$ through $N_m$, and the respective data read lines $D_1$ through $D_m$ depend on the previous read out condition. However, in the following explanation, the potentials of these points are assumed to be the grounded potential at the initial state.

When the primary address line $C_2$ and the charge control clock $\emptyset_p$ bear the grounded level, the node 20 is charged.

Under these conditions when a desired secondary address line selected from the secondary address lines $C_{11}$ through $C_{1m}$ is selected to bear the power supply level, the corresponding data read line (one of the data read lines $D_1$ through $D_m$) is charged through the selected n-MOSFET (one of the n-MOSFETs $N_1$ through $N_m$). The n-MOSFETs $N_1$ through $N_m$ function to divide the parasitic capacitance derived from the charging operation into the sides of the node 20 and the data read lines $D_1$ through $D_m$. Thus, the parasitic capacitance at the side of the node 20 is held minimum, thereby shortening the charging period. The shortened charging period ensures the node 30 to be maintained at the initial state even though the NOR gate $G_1$ develops the charging current toward the node 30 while the charging operation is conducted to the selected data read line. Since the n-MOSFETs $N_1$ through $N_m$ are connected to the data read lines $D_1$ through $D_m$, the charging level of the data read lines $D_1$ through $D_m$ can be held lower than the power supply level even though the data read lines $D_1$ through $D_m$ have a considerably large parasitic capacitance. This will reduce the total power consumption.

When the charging operation is completed, the charge control clock $\emptyset_p$ returns to the power supply level to turn off the p-MOSFET $P_1$. One row address line selected from the row address lines $R_1$ through $R_n$ takes the power supply level in order to select one memory cell from the memory cells $M_{11}$ through $M_{mn}$. The data read line and the node 20 are discharged in accordance with the data memory condition of the selected memory cell. When the discharging operation is not conducted in accordance with the memory condition of the selected memory cell, the charged condition of the node 20 is maintained because the p-MOSFET $P_3$ is in the on state. The p-MOSFET $P_3$ is constructed to have the current capacity to compensate for the leakage current from the node 20. Accordingly, the direct current component is very little when the node 20 is discharged. When the node 30 reaches the power supply level due to the discharging current from the node 20, the p-MOSFET $P_3$ is turned off. The direct current component disappears, and the data reading operation is completed. The node 30 bears the power supply level only when the primary address line $C_2$ is selected and the charge is discharged from the data read line, because the primary address line $C_2$ is connected to one input terminal of the NOR gate $G_1$. Therefore, the re-selection operation is not required to be conducted to the node 30.

Although the memory cells of FIG. 3 are illustrated as the one-bit cells, the present invention is applicable to the read only memory, wherein each of the memory cells has a plurality of bits.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A read control system for a semiconductor read only memory which includes a plurality of memory cells aligned in a matrix fashion, said read control system comprising:
    data read lines commonly connected, in a parallel fashion, to the memory cells aligned in one dimension;
    read out data output means connected to said data read lines;
    first switching means interposed between said read out data output means and each of said data read lines for selecting one of said data read lines, said first switching means including a plurality of n-MOSFETs each of which includes,
        a drain electrode connected to one of said data read lines;
        a source electrode connected to said read out data output means; and
        a gate electrode receiving a secondary column address signal;
    charging means for charging the selected data read line to a desired level;
    second switching means interposed between said charging means and said first switching means, said second switching means including a p-MOSFET which includes;
        a source electrode connected to said charging means,
        a drain electrode commonly connected to said source electrode of said plurality of n-MOSFETs included in said first switching means, and
        a gate electrode receiving a primary column address signal;
    a plurality of row address lines each of which is commonly connected to the memory cells aligned in the other dimension; and read means for selecting one of said plurality of row address lines after the charging operation conducted by said charging means in completed, thereby applying discharging current flowing through the selected memory cell and through the selected data read line to said read out data output means.

2. The read control system of claim 1, wherein said read out data output means includes a NOR gate having:
- a first input terminal commonly connected to said source electrode of said plurality of n-MOSFETs included in said first switching means;
- a second input terminal receiving said primary column address signal; and
- an output terminal developing a detection output.

3. The read control system of claim 2, wherein said charging means includes a p-MOSFET which comprises:
- a source electrode connected to a power supply level;
- a drain electrode connected to said source electrode of said p-MOSFET included in said second switching means; and
- a gate electrode receiving a charge timing control signal.

4. The read control system of claim 3, wherein said charging means includes another p-MOSFET connected to said p-MOSFET in a parallel fashion, said another p-MOSFET comprising:
- a source electrode connected to said power supply level;
- a drain electrode connected to said source electrode of said p-MOSFET included in said second switching means; and
- a gate electrode receiving said detection output developed from said output terminal of said NOR gate included in said read out data output means.

* * * * *